United States Patent
Crema

(10) Patent No.: US 12,125,803 B2
(45) Date of Patent: Oct. 22, 2024

(54) METHOD OF MANUFACTURING SEMICONDUCTOR DEVICES, CORRESPONDING APPARATUS AND SEMICONDUCTOR DEVICE

(71) Applicant: STMicroelectronics S.r.l., Agrate Brianza (IT)

(72) Inventor: Paolo Crema, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 18/121,145

(22) Filed: Mar. 14, 2023

(65) Prior Publication Data

US 2023/0215819 A1    Jul. 6, 2023

Related U.S. Application Data

(62) Division of application No. 17/108,187, filed on Dec. 1, 2020, now Pat. No. 11,610,849.

(30) Foreign Application Priority Data

Dec. 2, 2019   (IT) .................. 102019000022641

(51) Int. Cl.
*H01L 23/495*       (2006.01)
*B23K 26/0622*     (2014.01)
(Continued)

(52) U.S. Cl.
CPC ........ *H01L 23/562* (2013.01); *B23K 26/0622* (2015.10); *B23K 26/354* (2015.10);
(Continued)

(58) Field of Classification Search
None
See application file for complete search history.

(56) References Cited

U.S. PATENT DOCUMENTS

| 4,239,789 A | 12/1980 | Blum et al. |
| 2002/0117740 A1 | 8/2002 | Jang et al. |

(Continued)

FOREIGN PATENT DOCUMENTS

| CN | 102925938 A | 2/2013 |
| JP | H03149865 A | 6/1991 |
| KR | 1020110029901 A | 3/2011 |

OTHER PUBLICATIONS

IT Search Report and Written Opinion for IT Appl. No. 102019000022641 filed Jun. 10, 2020 (9 pages).
(Continued)

*Primary Examiner* — Jay C Chang
(74) *Attorney, Agent, or Firm* — Crowe & Dunlevy LLC

(57) ABSTRACT

A leadframe has a die pad area and an outer layer of a first metal having a first oxidation potential. The leadframe is placed in contact with a solution containing a second metal having a second oxidation potential, the second oxidation potential being more negative than the first oxidation potential. Radiation energy is then applied to the die pad area of the leadframe contacted with the solution to cause a local increase in temperature of the leadframe. As a result of the temperature increase, a layer of said second metal is selectively provided at the die pad area of the leadframe by a galvanic displacement reaction. An oxidation of the outer layer of the leadframe is then performed to provide an enhancing layer which counters device package delamination.

20 Claims, 2 Drawing Sheets

(51) Int. Cl.
*B23K 26/354* (2014.01)
*H01L 21/48* (2006.01)
*H01L 21/56* (2006.01)
*H01L 23/00* (2006.01)
*H01L 23/31* (2006.01)
*B23K 103/08* (2006.01)

(52) U.S. Cl.
CPC ........ *H01L 21/4825* (2013.01); *H01L 21/565* (2013.01); *H01L 23/3114* (2013.01); *H01L 23/49503* (2013.01); *H01L 23/49513* (2013.01); *H01L 23/49582* (2013.01); *B23K 2103/08* (2018.08)

(56) References Cited

U.S. PATENT DOCUMENTS

| | | |
|---|---|---|
| 2004/0155321 A1 | 8/2004 | Abbott |
| 2008/0233683 A1 | 9/2008 | Kwan et al. |
| 2009/0250796 A1 | 10/2009 | Tsui et al. |
| 2009/0315159 A1* | 12/2009 | Abbott .............. H01L 23/49565 29/34 R |
| 2013/0025745 A1 | 1/2013 | Abbott et al. |
| 2015/0014829 A1 | 1/2015 | Abbott |
| 2018/0240741 A1* | 8/2018 | Cook ................ H01L 23/49582 |
| 2019/0157196 A1 | 5/2019 | Sonehara et al. |

OTHER PUBLICATIONS

"Simple: Just Add the one on the Left to the one on the Right, Standard Reduction Potentials," retrieved Aug. 11, 2022, from http://mccord.cm.utexas.edu/curses/spring2016/ch302/standard-pots-redox.php, 5 pgs., 2022.

First Office Action and Search Report for counterpart CN Appl. No. 202011403687.5, report dated Oct. 11, 2023, 7 pgs.

* cited by examiner

METHOD OF MANUFACTURING SEMICONDUCTOR DEVICES, CORRESPONDING APPARATUS AND SEMICONDUCTOR DEVICE

CROSS REFERENCE TO RELATED APPLICATIONS

This application is a divisional of U.S. patent application Ser. No. 17/108,187, filed Dec. 1, 2020, now U.S. Pat. No. 11,610,849, which claims the priority benefit of Italian Application for Patent No. 102019000022641, filed on Dec. 2, 2019, the contents of which are hereby incorporated by reference in their entireties to the maximum extent allowable by law.

TECHNICAL FIELD

The description relates to manufacturing semiconductor devices.

One or more embodiments may be applied to manufacturing integrated circuits (ICs).

BACKGROUND

Providing packaged semiconductor devices with improved resistance to package delamination represents a growing trend in manufacturing semiconductor devices (e.g., for the automotive sector).

High resistance to package delamination may be achieved with fabrication processes in which the top layer of the leadframe (e.g., a silver layer) is provided (e.g., coated) with a so-called enhancing layer of a material having higher affinity with the package molding compound (e.g., epoxy molding compounds).

It is noted that the presence of an enhancing layer covering the leadframe may negatively affect the wettability of the leadframe surface, possibly having an adverse impact on the soft solder die attach process, i.e., the process of attaching a semiconductor die on the die pad area of the leadframe via soft-solder attaching material.

Despite the extensive activity in the area, further improved solutions are desirable.

There is a need in the art to contribute in providing such improved solutions.

SUMMARY

One or more embodiments may relate to a method.

One or more embodiments may relate to a corresponding apparatus.

One or more embodiments may relate to a corresponding semiconductor device (e.g., an integrated circuit).

One or more embodiments may involve (selective) deposition of a noble metal layer (e.g., gold) on the die pad area of the leadframe via galvanic displacement reaction enhanced by light (e.g., laser) radiation, prior to forming the enhancing layer via an oxidation reaction.

One or more embodiments may rely on the recognition that a layer of a noble metal (e.g., gold) at the die pad area will not get oxidized (or will get only slightly oxidized) during formation of the enhancing layer, thereby preserving the wettability of the die pad area which facilitates soft-solder die attachment.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
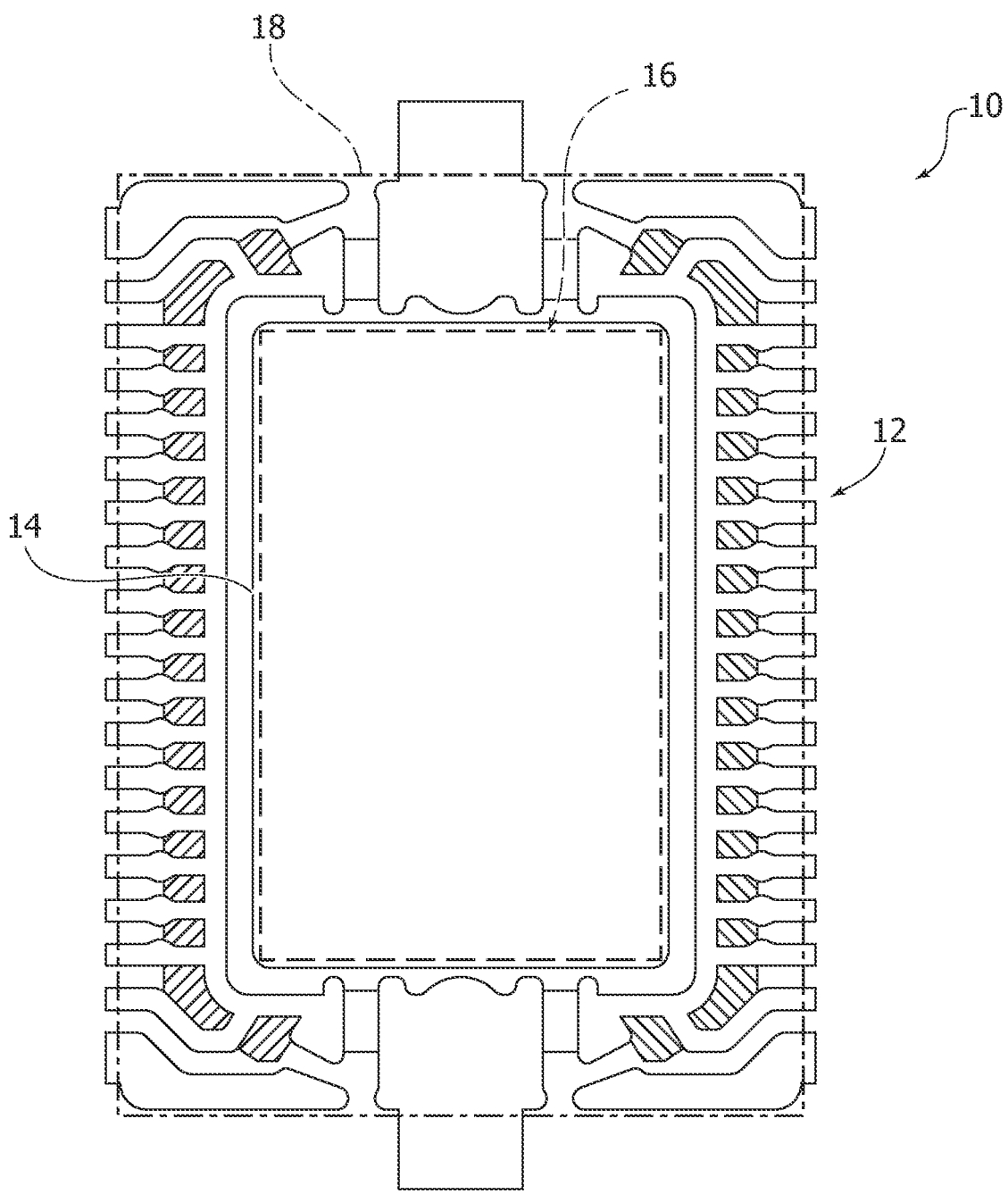
FIG. 1 is an exemplary representation of a semiconductor device adapted to be manufactured according to embodiments.

FIG. 1 is a schematic representation of a semiconductor device 10 such as an integrated circuit (IC) observed in a plan (top) view.

As currently known in the art, together with other elements/features not visible in the figure, a device 10 as exemplified herein may comprise a so-called leadframe 12 having a (central, for instance) die pad area 14 and (at least) one semiconductor chip or die 16 attached onto the die pad area 14 of the leadframe 12 via a soft-solder process.

The designation "leadframe" (or "lead frame") is currently used (see, for instance, the Consolidated Glossary of USPC Terms of the United States Patent and Trademark Office) to indicate a metal frame which provides support for an integrated circuit chip or die as well as electrical leads to interconnect the integrated circuit in the die or chip to other electrical components or contacts.

Essentially, a lead frame comprises an array of electrically-conductive formations (leads) which, from an outline location, extend inwardly in the direction of a semiconductor chip or die thus forming an array of electrically-conductive formations from a die pad configured to have at least one semiconductor chip or die attached thereon.

A package 18 can be molded onto the semiconductor die or dice 16 attached onto the die pad area 14 of the leadframe 12 to provide a device package having the external (distal) tips of the leads in the leadframe 12 protruding from the package 18.

The general structure and manufacturing process of a semiconductor device 10 as exemplified in FIG. 1 (including the provision of various additional elements such as wire bonding coupling the leads of the leadframe to the semiconductor die or dice, and so on, not visible in the figure) are well known to those of skill in the art, which makes it unnecessary to provide a more detailed description herein.

A conventional solution for manufacturing a device such as the semiconductor device 10 exemplified herein may involve providing a leadframe 12 in the form of a (ribbon-like) strip of metal material such as copper. Such a strip may comprise plural sections 12. Each of these includes a respective die pad area 14 onto which respective semiconductor dice can be attached.

The various sections of the ribbon-like structure can be eventually separated ("singulated") prior to or following molding of respective packages 18 to provide individual devices.

A conventional solution in implementing a process as discussed previously involves forming onto the metal material (e.g., copper) of the leadframe 12 a so-called enhancing layer having higher affinity with the molding compound 18 which is eventually molded onto the leadframe 12 and the semiconductor die or dice 16 attached thereon.

Such a molding compound may conventionally comprise resin material such as epoxy resin molding compound (EMC, Epoxy Molding Compound).

Providing the enhancing layer may involve providing onto the basic material of the leadframe 12 (a metal such as copper, for instance) a coating of another material (a metal such as silver, for instance) which is processed to form the enhancing layer. For instance, according to the treatment process designated NEAP 4.0 (NEAP=Non-Etching Adhesion Promoter), an upper layer (10-30 Å of thickness, 1 Å=$10^{-10}$ m) of silver oxide ($AgO_x$) is formed "on top" of the silver coating by oxidizing the silver layer.

As discussed previously, while promoting good adhesion with the package compound, the enhancing layer was found to adversely affect the attachment process of the semiconductor die or dice 16 onto the die pad area 14 of the leadframe 12.

Even without wishing to be bound to any specific theory in that respect, the enhancing layer (silver oxide) may negatively affect "wettability" of the leadframe material (copper coated by silver) by soft-solder attach material.

A composition of Pb 95%/Sn 5% or sometimes 1-2% Ag and Sn balance may be exemplary of such a soft-solder attach material.

In order to preserve satisfactory wettability of the die pad area 14, one or more embodiments may involve selectively depositing a layer of a noble metal (e.g., a metal selected out of palladium (Pd), platinum (Pt), and gold (Au), preferably gold) on top of the silver coating of the leadframe 12 at the die pad area 14, prior to performing oxidation of the silver layer to form the enhancing layer (which may comprise, e.g., hydroxylated silver oxide).

Selective deposition of a metal layer on certain areas may conventionally be achieved by using a mask (mechanical or photoresist). Such conventional approach has the drawbacks of low throughput, high cost of the materials (e.g., of the photoresist) and need for dedicated tools.

In order to mitigate such drawbacks, in one or more embodiments the silver-coated leadframe may be coated (e.g., plated) with a noble metal such as gold at selected areas by resorting to a galvanic displacement reaction. In particular, it is noted that dipping a piece of silver (or a silver-coated object, such as the leadframe 12) into a solution containing $Au^+$ ions, the gold tends to coat the surface of silver, and some silver gets dissolved into the solution in the form of $Ag^+$ ions (i.e., a metal displacement reaction takes place). The Nernst formula $E=E^0+nRT \cdot \ln(Ox/Red)$ or $E=E^0 0.059 \cdot Log(Ox/Red)$ describes the thermodynamics of the redox reaction involved in galvanic displacement. It is noted that temperature plays an important role in determining the dynamics of the galvanic displacement reaction.

Figure 2:
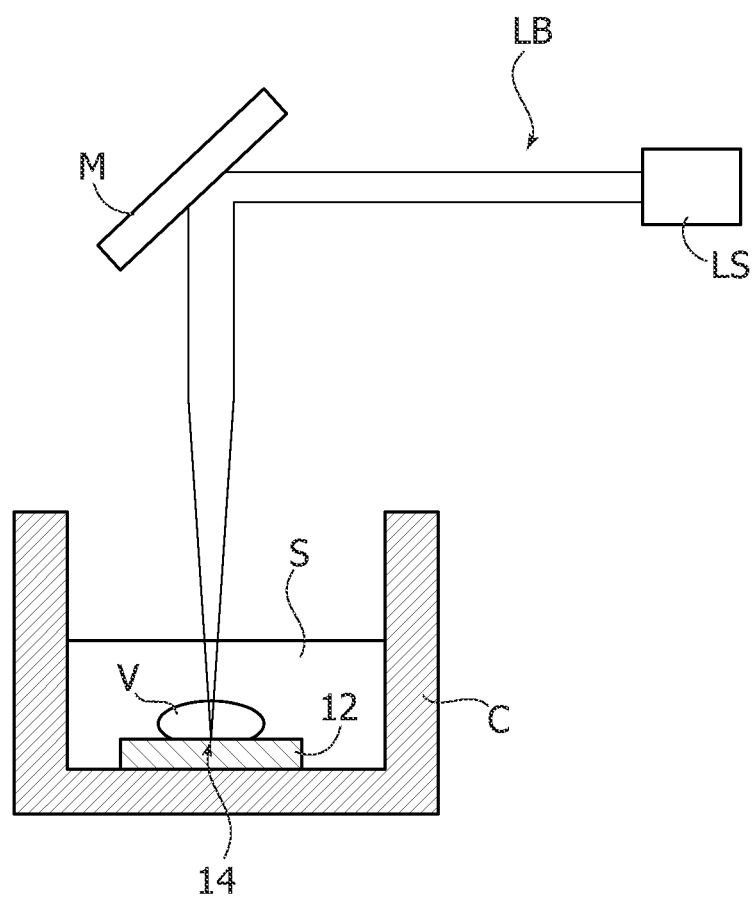
FIG. 2 is exemplary of a possible manufacturing step.

As exemplified in FIG. 2, in one or more embodiments the silver-coated leadframe 12 to be selectively coated (e.g., plated) with gold may be dipped into an aqueous solution S (e.g., contained in a container or vessel C) of gold complex (e.g., having high free cyanide content) at a low temperature (e.g., about 3° C. to 8° C., preferably about 5° C.). At low temperature, the kinetics of the galvanic displacement reaction (gold reduction vs. silver oxidation) is extremely slow, thereby resulting in almost negligible gold deposition.

One or more embodiments may contemplate scanning a laser beam LB of suitable wavelength (e.g., 532 nm) and pulse duration (e.g., in the microsecond range) through the aqueous solution S on the area to be plated, i.e., the die pad area 14 of the leadframe 12. For instance, the laser beam LB may be produced by a laser source LS and directed towards the selected area 14 by means of a mirror M.

In one or more embodiments, pulse duration and/or power of the laser beam LB and/or overall exposure time may be tuned so to result in the radiation energy being applied on the die pad area 14 of the leadframe 12 at an amount of about 5 $mJ/mm^2$ to 500 $mJ/mm^2$, preferably about 100 $mJ/mm^2$.

Scanning the laser beam LB on selected areas of the leadframe 12 may thus result in local increase of the temperature of the base material (i.e., the metallic leadframe) and the neighboring volume V of aqueous solution, which facilitates achieving the electrochemical conditions which lead to the (vigorous) deposition of a more noble metal (e.g., gold) by galvanic displacement reaction with a less noble metal (e.g., silver). For instance, in one or more embodiments the temperature of the leadframe 12 may be increased locally (e.g., only at the die pad area 14) to a temperature between about 15° C. to 65° C., preferably about 50° C.

In one or more embodiments, the laser wavelength may be selected to avoid high absorbance by the aqueous solution. For instance, in one or more embodiments the radiation may be absorbed by the solution S less than about 30%, or even less. This may facilitate increasing the temperature of the base metal (i.e., of the leadframe 12) and transferring heat to the solution, and not vice versa.

In the exemplary case of an aqueous solution containing gold particles (ions), the wavelengths falling within the spectrum of typical gold salt solutions (i.e., yellow) should be avoided. Additionally, water molecules may provide absorption in the infrared range, which should therefore also be avoided. Thus, in one or more exemplary embodiments, "green" radiation having a wavelength of 495 nm to 570 nm, preferably 520 nm to 540 nm, more preferably at 532 nm, may be selected for the laser beam LB. Such a green radiation may be obtained by a Nd-Yag solid state laser doubled in frequency.

In one or more embodiments, a (very thin) gold layer may be plated also on unwanted areas of the leadframe 12 (e.g., outside of the die pad area 14) due to residual displacement reaction on areas which are not illuminated by the laser radiation. Mild back stripping may be performed on such areas to remove the (thin) undesired gold layer.

In one or more embodiments, the laser source LS may be programmed (e.g., via software) to scan the laser beam (only) on certain selected areas of the leadframe 12 (e.g., the die pad area 14).

One or more embodiments may thus be advantageous in reducing manufacturing costs of integrated circuits (e.g., because a masking step is not necessary).

One or more embodiments may be applied on three-dimensional parts of the leadframe 12, where masks cannot be implemented.

In one or more embodiments, after coating the die pad area 14 with a noble metal by galvanic displacement reaction enhanced by laser, the leadframe 12 may be subject to oxidation processing to provide a silver oxide enhancing layer on the remaining parts of the leadframe 12, thereby preserving wettability of the die pad area 14 towards soft-solder attach material.

As exemplified herein, a method of manufacturing semiconductor devices (e.g., 10) may comprise:

providing a leadframe (e.g., 12) having a die pad area (e.g., 14), the leadframe comprising an outer layer of a first metal having a first oxidation potential, contacting said leadframe with a solution (e.g., an aqueous solution S) containing a second metal having a second oxidation potential, the second oxidation potential being more negative than the first oxidation potential, applying radiation energy (e.g., a light beam or a laser beam LB) to the die pad area of the leadframe contacted with said solution to locally increase the temperature of the leadframe, wherein a layer of said second metal is selectively provided at the die pad area of the leadframe by galvanic displacement reaction, providing an enhancing layer onto said leadframe by oxidation of said outer layer of the leadframe, the enhancing layer countering device package delamination, attaching onto said die pad area at least one semiconductor die (e.g., 16) via soft-solder die attach material, and forming a device package (e.g., 18) by molding package material onto the at least one semiconductor die attached onto said die pad area of the leadframe.

As exemplified herein, the solution may have a temperature of about 3° C. to 8° C., preferably about 5° C.

As exemplified herein, the solution may comprise metal complexes and/or metal ions of said second metal.

As exemplified herein, the radiation energy may comprise laser radiation at a wavelength which is absorbed by the solution less than about 30%.

As exemplified herein, the first metal of said outer layer of the leadframe may comprise silver, and said solution may contain at least one second metal selected out of the group comprising palladium, platinum and gold.

As exemplified herein, the second metal may comprise gold and the radiation energy may comprise laser radiation at a wavelength of about 495 nm to 570 nm, preferably about 520 nm to 540 nm, more preferably about 532 nm.

As exemplified herein, the temperature of the leadframe may be locally increased to about 15° C. to 65° C., preferably about 50° C., by applying said radiation energy on the die pad area.

As exemplified herein, the radiation energy may be applied on the die pad area of the leadframe at an amount of about 5 mJ/mm² to 500 mJ/mm², preferably about 100 mJ/mm².

As exemplified herein, back stripping may be performed to remove said layer of said second metal from areas of the leadframe other than the die pad area.

As exemplified herein, an apparatus may comprise:

a vessel (e.g., C) configured to maintain a leadframe in contact with a solution containing said second metal, and a radiation energy source (e.g., LS) configured to scan a radiation energy beam onto the die pad area of said leadframe in said vessel to locally increase the temperature of the leadframe, wherein a layer of said second metal is selectively provided at the die pad area of the leadframe by galvanic displacement reaction.

As exemplified herein, a semiconductor device may comprise:

a leadframe having a die pad area, at least one semiconductor die, soft-solder die attach material attaching said at least one semiconductor die onto said die pad area, a device package of package material molded onto the at least one semiconductor die attached onto said die pad area of the leadframe, wherein:

the leadframe comprises an outer layer of a first metal having a first oxidation potential, the die pad area of the leadframe is provided with a layer of a second metal resulting from a galvanic displacement reaction, the second metal having a second oxidation potential more negative than the first oxidation potential, said outer layer of the leadframe is oxidized to provide an enhancing layer onto said leadframe, the enhancing layer countering device package delamination, wherein said die pad area of the leadframe is at least partially exempt from said enhancing layer, and soft-solder die attach material attaches the at least one semiconductor die onto said die pad area, the soft-solder die attach material provided where the die pad area of the leadframe is exempt from said enhancing layer.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is defined by the annexed claims.

The invention claimed is:

1. An apparatus for selectively providing a layer of a second metal at a die pad area of a leadframe including an outer layer made of a first metal, wherein an oxidation potential of the second metal is more negative than an oxidation potential of the first metal, the apparatus comprising:

a vessel configured to maintain said leadframe in contact with a solution containing said second metal; and a radiation energy source configured to scan a radiation energy beam onto the die pad area of said leadframe in said vessel, said radiation energy beam causing a local increase in a temperature of the leadframe which results in a selective provision of a layer of said second metal at the die pad area by a galvanic displacement reaction.

2. The apparatus of claim 1, wherein said second metal comprises gold and wherein said radiation energy beam comprises laser radiation at a wavelength of 495 nm to 570 nm.

3. The apparatus of claim 2, wherein the wavelength is between 520 nm and 540 nm.

4. The apparatus of claim 3, wherein the wavelength is 532 nm.

5. The apparatus of claim 1, wherein said solution has a temperature of 3° C. to 8° C.

6. The apparatus of claim 1, wherein said solution comprises at least one of metal complexes of said second metal or metal ions of said second metal.

7. The apparatus of claim 1, wherein said first metal comprises silver, and said second metal is selected from a group consisting of: palladium, platinum and gold.

8. The apparatus of claim 1, wherein the local increase in the temperature by applying said radiation energy beam on the die pad area is to a temperature level of 15° C. to 65° C.

9. The apparatus of claim 8, wherein the temperature level is 50° C.

10. The apparatus of claim 1, wherein the radiation energy beam is applied on the die pad area of the leadframe at an amount of 5 mJ/mm$^2$ to 500 mJ/mm$^2$.

11. An apparatus, comprising:
a vessel containing a solution including a second metal;
a radiation energy source configured to generate a radiation energy beam;
a scanning device configured to direct the radiation energy beam into the solution;
wherein said vessel is configured to receive a leadframe including a die pad area having an outer layer made of a first metal;
wherein an oxidation potential of the second metal is more negative than an oxidation potential of the first metal; and
wherein said scanning device is controlled to scan the radiation energy beam onto the die pad area of said leadframe in said vessel to form a layer of said second metal at the die pad area by a galvanic displacement reaction.

12. The apparatus of claim 11, wherein application of said radiation energy beam onto the die pad area of said leadframe causes a local increase in a temperature of the leadframe.

13. The apparatus of claim 11, wherein said vessel is configured to maintain said leadframe in contact with the solution.

14. The apparatus of claim 11, wherein said solution comprises metal complexes of said second metal.

15. The apparatus of claim 11, wherein said solution comprises metal ions of said second metal.

16. The apparatus of claim 11, wherein said first metal comprises silver, and said second metal is selected from a group consisting of: palladium, platinum and gold.

17. The apparatus of claim 11, wherein the radiation energy source generates the radiation energy beam with a radiation energy at an amount of 5 mJ/mm$^2$ to 500 mJ/mm$^2$.

18. The apparatus of claim 11, wherein said radiation energy beam comprises laser radiation at a wavelength between 495 nm and 570 nm.

19. The apparatus of claim 11, wherein said radiation energy beam comprises laser radiation at a wavelength between 520 nm and 540 nm.

20. The apparatus of claim 11, wherein said radiation energy beam comprises laser radiation at a wavelength which is absorbed by the solution less than 30%.

* * * * *